United States Patent [19]

Dagostino

[11] 4,251,815
[45] Feb. 17, 1981

[54] SIGNAL-ENVELOPE DISPLAY SYSTEM FOR A DIGITAL OSCILLOSCOPE

[75] Inventor: Thomas P. Dagostino, Beaverton, Oreg.

[73] Assignee: Tektronix, Inc., Beaverton, Oreg.

[21] Appl. No.: 76,531

[22] Filed: Sep. 18, 1979

[51] Int. Cl.³ .............................................. G08B 5/36
[52] U.S. Cl. ................................ 340/722; 324/121 R; 340/799; 340/739; 364/900
[58] Field of Search ..................... 340/722; 324/121 R

[56] References Cited

U.S. PATENT DOCUMENTS

| 3,872,461 | 3/1975 | Jarosik et al. | 324/121 R |
| 3,965,419 | 6/1976 | Paiva | 324/121 R |
| 3,968,499 | 7/1976 | Lowe et al. | 340/722 X |
| 4,086,579 | 4/1978 | Easter | 340/722 X |

Primary Examiner—David L. Trafton
Attorney, Agent, or Firm—George T. Noe

[57] ABSTRACT

A signal-envelope display system for a digital oscilloscope includes a memory for storing minimum and maximum signal values in adjacent storage locations, an address counter for sequentially addressing the memory, and a control circuit for selecting the least significant bit of the address count signal arriving at the memory from the least significant bit of the address count signal, a fixed logical low, or a fixed logical high to there by select every address location of the memory, or only the even locations, or only the odd locations over a given count cycle. The values retrieved from memory are converted to analog values and a vector generator connects the analog values to provide connected minimum and maximum values, connected maximum values, and connected minimum values for display. A signal-envelope display is provided by superposing the three displays.

7 Claims, 7 Drawing Figures

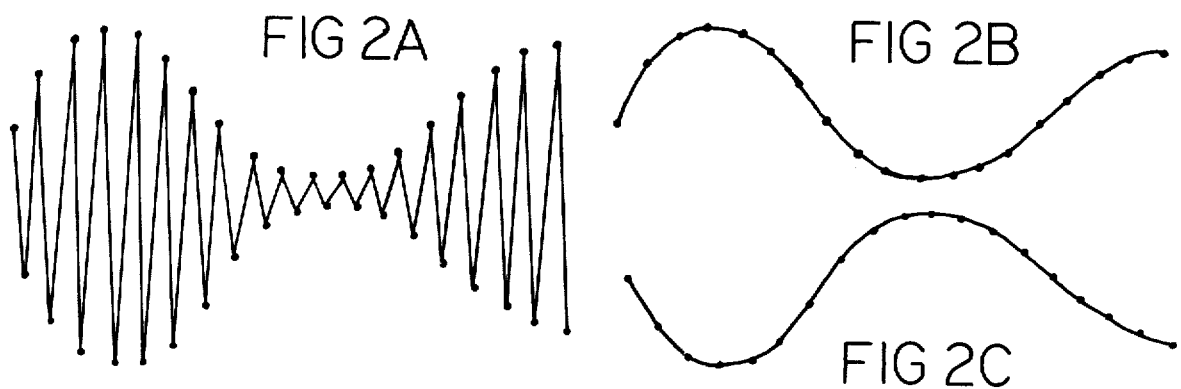
FIG 2A    FIG 2B
FIG 2C
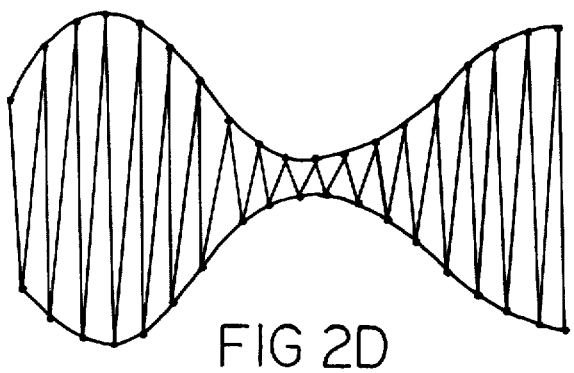
FIG 2D
| C1 | C2 | LSB' |
|----|----|------|
| 0  | 1  | 0    |
| X  | 0  | 1    |
| 1  | 1  | LSB  |
FIG 4
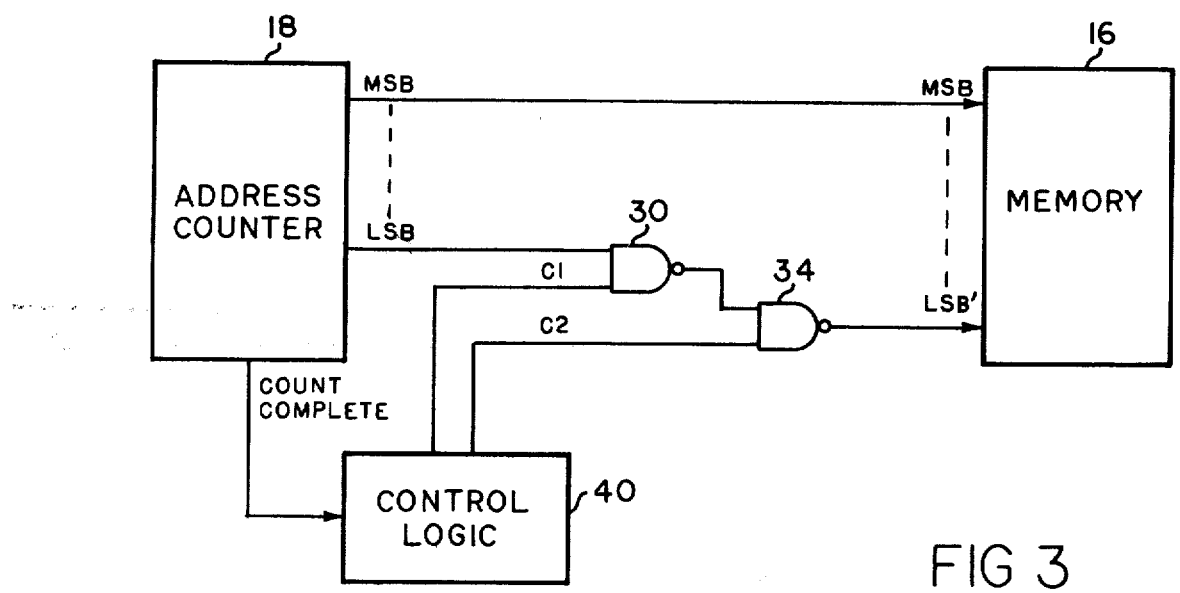
FIG 3

SIGNAL-ENVELOPE DISPLAY SYSTEM FOR A DIGITAL OSCILLOSCOPE

BACKGROUND OF THE INVENTION

This invention relates generally to display systems for digital oscilloscopes, and in particular to a system for reproducing the envelope of complex signals such as carrier signals. Real-time oscilloscopes provide a continuous time-based display of the instantaneous amplitude values of electrical phenomena, and are thus able to accurately display the waveforms of complex signals, such as high-frequency carrier signals having low-frequency envelopes. These types of waveforms, as well as other types, are also displayable by real-time oscilloscopes equipped with direct-view bistable storage tubes because the signal processing circuits and recording medium are continuous. On the other hand, digital oscilloscopes chop input signals into time points determined by an internal clock, quantize the instantaneous amplitude values at those points, and store the resulting digital representations in a digital memory. The display is regenerated from memory at a predetermined clock rate, and is manifested either as a series of dots, or connected dots. Since the input signals are not functionally related to the internal clock of the digital oscilloscope, whatever the instantaneous value of the input signal happens to be when the clock edge occurs is what gets stored. The information between such points, of course, is lost, so that for complex signals, an intelligible waveform is difficult, if not impossible, to reconstruct.

A method for determining the minimum and maximum amplitude values of repetitive waveforms has now been developed for digital oscilloscopes and is disclosed in co-pending application Ser. No. 61,720, filed July 30, 1979, entitled "Waveform Storage System." It would be desirable to utilize these minimum and maximum values to reproduce the envelope of complex signals.

SUMMARY OF THE PRESENT INVENTION

In accordance with the present invention, a signal-envelope display system is provided for a digital oscilloscope. The associated waveform acquisition system includes a circuit for detecting the minimum and maximum signal amplitudes occurring over short time increments, and these minimums and maximums are actually stored as the acquired data points along the waveform in place of the instantaneous values actually occurring at those points. Hence, two memory locations are required to store all of the data for a given point.

For the display, data representing the minimum and maximum signal amplitudes at each data point are stored in adjacent addressable locations in a display memory. A binary address counter is connected to the display memory to sequentially address each storage location in response to a display clock signal. A control circuit is interposed between the address counter and the display memory to control the least significant bit of the address count signal thereby to provide four display modes. In a first display mode, the least significant bit is allowed to pass to memory so that data representing minimum and maximum signal values are alternately clocked out of memory. An associated vector generator then connects the minimums and maximums to provide a display signal. In a second display mode, the least significant bit applied to the memory is held low for the entire clocking cycle so that every other storage location is addressed, for example, even locations where only maximum values are stored. Thus, all of the maximum values are clocked out in succession. The associated vector generator connects the maximum values to provide a display signal. In a like manner, a third display mode is provided in which the least significant bit is held high for the entire clocking signal so that only odd locations are addressed, clocking out all of the stored minimum values, from which a display signal may be regenerated. The fourth display is a combination of the first three in which on three successive address count cycles, the three aforementioned modes are utilized in succession. On the first pass, both minimum and maximum values are clocked out of memory. On the second pass, only the minimum values are clocked out, and on the third pass, only the maximum values are clocked out. The three resulting waveforms are superposed on an associated display screen, which appears to an observer as a single display of the filled-in envelope of a complex waveform.

In a preferred embodiment of the invention, the least significant bit (LSB) control circuit comprises two NAND gates controllable by just two control bits from a logic control circuit.

It is therefore one object of the present invention to provide a signal envelope display system for a digital oscilloscope.

It is another object to provide digital oscilloscopes with the capability of displaying complex waveforms.

It is a further object to provide digital oscilloscopes with alternative display modes in which signal minimums or maximums, or both, may be displayed.

Other objects and advantages of the present invention will become apparent upon a reading of the following description when taken in conjunction with the accompanying drawings.

BRIEF DESCRIPTION OF THE DRAWINGS

FIGS. 2A-2D are waveforms associated with the block diagram of FIG. 1;

FIG. 3 is a schematic diagram of the LSB control gating circuit in accordance with the preferred embodiment; and FIG. 4 is a truth table of the gating circuit of FIG. 3.

DETAILED DESCRIPTION OF THE INVENTION

Figure 1:
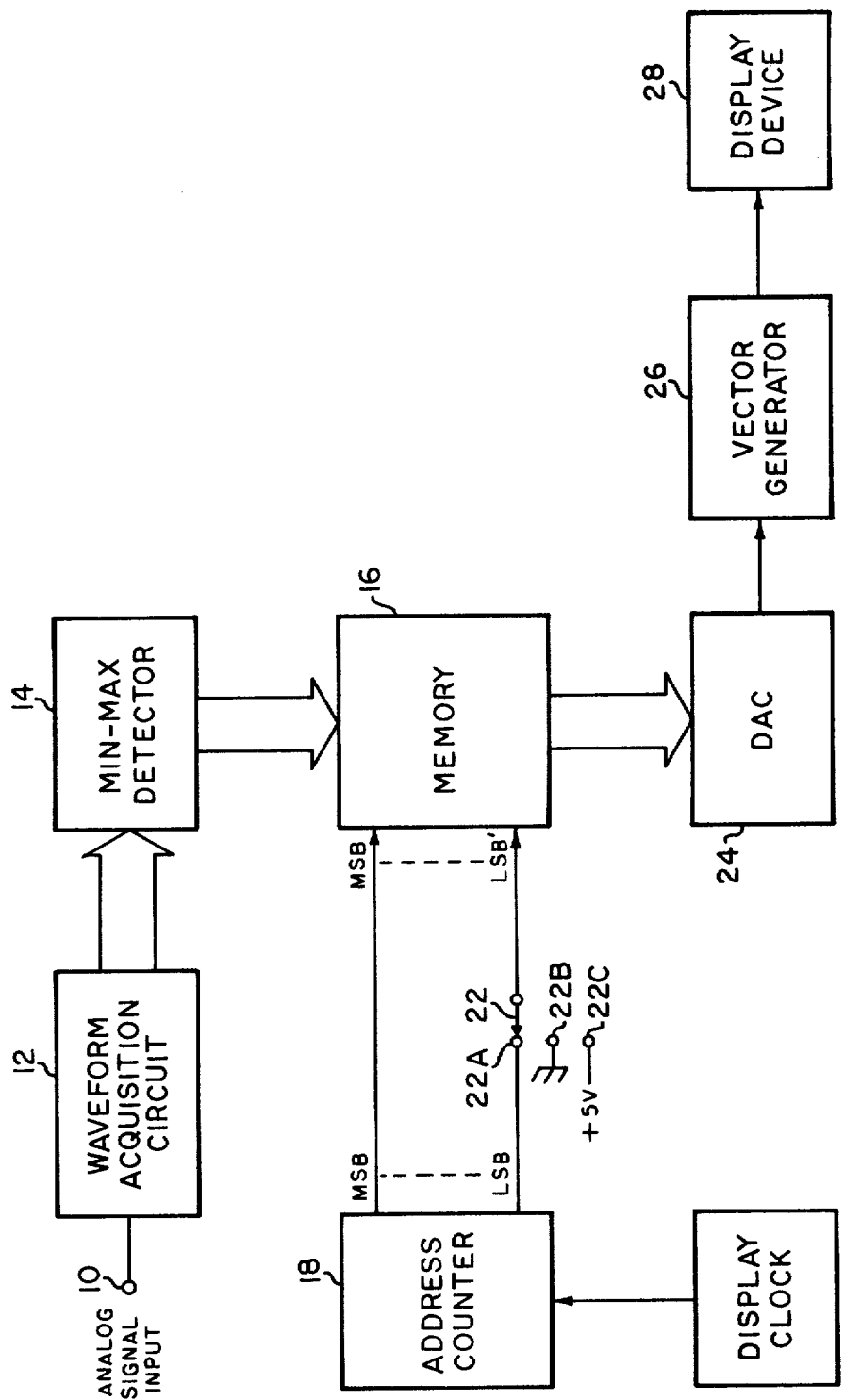
FIG. 1 is a block diagram of a display system in accordance with the present invention.

Referring to FIG. 1, a block diagram of a digital oscilloscope display is shown in which analog signals are applied via an input terminal 10 to a waveform acquisition circuit 12, which includes the well-known sample- and-hold and analog-to-digital converter circuits utilized by conventional digital oscilloscopes. While the number of points acquired along the waveform of an input signal are limited by available memory space, waveform acquisition circuit 12 may suitably operate as taught in co-pending patent application Ser. No. 61,720, filed July 30, 1979, entitled "Waveform Storage System, " wherein a high speed sampling system acquires waveform data at the highest rate at which the analog-to-digital converter will operate. The waveform data thus acquired is applied to a min-max detector circuit 14, which detects and holds the lowest and highest signal values occurring over time increments corresponding to the time interval between data points, the number of which is mandated by the available memory space. Therefore, the stored data points comprise the minimum and maximum signal amplitudes which occur between the designated data points, rather than the actual instantaneous values occurring at those points. The minimum and maximum values are stored in adjacent memory locations in a display memory 16, which may suitably be a random-access memory (RAM).

A binary address counter 18 is connected to the memory 16 to sequentially address each storage location in response to a display clock signal from a display clock 20. In the conventional manner, the binary address counter 18 includes an output line for each binary count bit, arranged in descending order from the most significant bit (MSB) to the least significant bit (LSB). A switch 22 is interposed between the counter 18 and memory 16 on the LSB line to select the least significant bit actually applied to the memory (LSB') from LSB, ground, or a pull-up voltage to provide four display modes.

For the first display mode, switch 22 is connected to contact 22A, permitting LSB to pass to the memory. In this mode, each memory location is addressed sequentially, clocking out of memory the minimum and maximum signal values stored in adjacent memory locations. As this data is clocked out, it is converted to analog form by a digital-to-analog converter (DAC) 24. A vector generator 26 connects the dot output from DAC 24 to produce the connected minimum-maximum waveform of FIG. 2A, to be applied to a display device 28, which may suitably be a cathode-ray tube.

For the second display mode, the least significant bit input line of the memory is connected to ground through switch 22 and contact 22B. In this mode, every other memory location, for example, even locations where only maximum values are stored, is addressed sequentially, causing all of the maximum values to be clocked out of memory in succession. The DAC 24 and vector generator 26 produce the connected-dot display signal of the maximum values as shown in FIG. 2B.

For the third display mode, the least significant bit input line of the memory is connected to a pull-up voltage, e.g., +5 volts, through switch 22 and contact 22C. In this mode, every other memory location, for example, odd locations where only minimum values are stored, is addressed sequentially, causing all of the minimum values to be clocked out of memory in succession. The DAC 24 and vector generator 26 produce the connected-dot display signal of minimum values as shown in FIG. 2C.

In the fourth display mode, switch 22 is connected in sequence to each of the three contacts 22A, 22B, and 22C, remaining at each contact for a complete count cycle of address counter 18. On the first clock cycle pass of the memory, both minimum and maximum waveform values are clocked out and a display generated. On the second pass, only the minimum values are clocked out for display, and on the third pass, only the maximum values are clocked out for display. The three resulting display waveforms are superposed on the display screen of display device 28, which appears to an observer as a single display of the filled-in envelope of a complex waveform.

Because the foregoing circuit operation is designed to take place at high speed to produce a flicker-free observable envelope display, swtich 22 is preferably the logic control gating circuit of FIG. 3. The control gating circuit comprises two NAND gates 30 and 34, the operation of which is defined by the truth table shown in FIG. 4. A control logic circuit 40 generates two control bits C1 and C2 to control operation of the control gating circuit. If C1 is low and C2 is high, the output of NAND gate 30 is high, and the output of NAND gate 34 is low. Thus the least significant of the address count signal arriving at the memory 16 (LSB') is held low, corresponding to the 22B switch position of FIG. 1. If C2 is low, the output of NAND gate 34 is high, irrespective of the condition of C1. Thus, LSB' is high. If C1 is high and C2 is high, the actual least significant bit from address counter 16 passes through NAND gates 30 and 34 so that LSB'=LSB.

The control logic circuit 40 may be conditioned to establish any of the four above-described display modes or combinations thereof. The count over-flow line from the address counter 18 may be applied to the control logic circuit 40 to change the control bits C1 and C2 at the end of each clock cycle. The control logic circuit 40 may take many forms from an arrangement of gates and flip flops to a microprocessor.

It will be obvious to those having ordinary skill in the art that many changes may be made in the above-described details of the preferred embodiment of the present invention without departing from the spirit and scope of the present invention. Therefore, the scope of the present invention should be determined only by the following claims.

What I claim as being novel is:

1. A display system for a digital oscilloscope, comprising:

a waveform memory for storing minimum and maximum signal amplitude values in adjacent addressable storage locations.

means for addressing said memory to selectively retrieve said minimum and maximum values; and means responsive to said retreived values for providing a display signal therefrom.

2. A display system in accordance with claim 1 wherein said means for addressing said memory comprises an address counter for providing a binary address count signal and control circuit means for controlling the least significant bit of said address count signal to thereby control address selection of said storage locations.

3. A display system in accordance with claim 2 wherein said control circuit means comprises switch means interposed between said address counter and said memory for selecting between a least significant bit of said binary address count signal, a fixed logical low, and a fixed logical high as the least significant bit applied to said memory.

4. A display system in accordance with claim 3 wherein said control circuit means further comprises a logic control circuit, and said switch means comprises a pair of NAND gates controllable by said logic control circuit.

5. A display system in accordance with claim 1 wherein said means for providing a display signal comprises a digital-to-analog converter and a vector generator.

6. A display system for a digital oscilloscope, comprising:

a waveform memory containing minimum and maximum signal amplitude values representative of the envelope of a waveform;

means for selectively retrieving the minimum values, the maximum values, or a combination of both minimum and maximum values; and means responsive to said retrieved values for regenerating minimum-value waveforms and maximum-value waveforms for superposition on a display device to provide an envelope display.

7. A display system in accordance with claim 6 wherein said retrieving means comprises an address counter for producing a binary address count signal, and means for controlling the condition of the least significant bit of said count signal.

* * * * *